(12) United States Patent
Martin

(10) Patent No.: US 8,193,684 B2
(45) Date of Patent: *Jun. 5, 2012

(54) V-SHAPED OR U-SHAPED PIEZOELECTRIC DEVICE FOR GENERATING AN ELECTRICAL VOLTAGE

(76) Inventor: Jean-Frederic Martin, Cremieu (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/003,580

(22) PCT Filed: Jul. 13, 2009

(86) PCT No.: PCT/FR2009/051399
§ 371 (c)(1),
(2), (4) Date: Jan. 11, 2011

(87) PCT Pub. No.: WO2010/007309
PCT Pub. Date: Jan. 21, 2010

(65) Prior Publication Data
US 2011/0109202 A1    May 12, 2011

(30) Foreign Application Priority Data
Jul. 17, 2008  (FR) ...................................... 08 54879

(51) Int. Cl.
*H01L 41/107* (2006.01)
*H02N 2/18* (2006.01)

(52) U.S. Cl. ........................ 310/339; 310/330; 310/331

(58) Field of Classification Search .......... 310/330–332, 310/339
See application file for complete search history.

(56) References Cited

U.S. PATENT DOCUMENTS

| | | | |
|---|---|---|---|
| 5,315,204 A * | 5/1994 | Park ............................ | 310/339 |
| 7,005,778 B2 | 2/2006 | Pistor | |
| 8,040,023 B2 * | 10/2011 | Laermer et al. ............... | 310/339 |
| 2005/0280561 A1 | 12/2005 | Face et al. | |
| 2008/0150396 A1 | 6/2008 | Clingman et al. | |
| 2009/0243254 A1 * | 10/2009 | Chiang et al. ................. | 310/339 |
| 2009/0284102 A1 * | 11/2009 | Karakaya et al. ............. | 310/339 |
| 2010/0219720 A1 * | 9/2010 | Namuduri et al. ............. | 310/339 |
| 2010/0244629 A1 * | 9/2010 | Nagashima et al. .......... | 310/339 |
| 2011/0109202 A1 * | 5/2011 | Martin .......................... | 310/339 |

FOREIGN PATENT DOCUMENTS

| | | |
|---|---|---|
| DE | 29614851 U1 | 11/1996 |
| DE | 102006025963 A1 | 12/2007 |
| EP | 0725452 A1 | 8/1996 |
| JP | 58204782 A | 11/1983 |
| JP | 10002973 A | 1/1998 |
| JP | 2006041150 A * | 2/2006 |

OTHER PUBLICATIONS

International Search Report for PCT/FR2009/051399 dated Jan. 12, 2009.

* cited by examiner

*Primary Examiner* — Jaydi San Martin
(74) *Attorney, Agent, or Firm* — Heslin Rothenberg Farley & Mesiti P.C.

(57) ABSTRACT

A piezoelectric device for generating an electrical voltage, comprises a vibrating plate having a portion integral with a fixed support and at least one free end capable of moving under the effect of a mechanical pulse, and at least one piezoelectric element attached to one face of the plate so as to deform under the effect of the oscillations of the plate that result from said mechanical pulse, thus generating an electrical voltage.
The plate has a U-shaped or V-shaped general configuration, possessing two substantially planar branches joined by a curved linking portion integral with the support.

16 Claims, 2 Drawing Sheets

Fig. 1
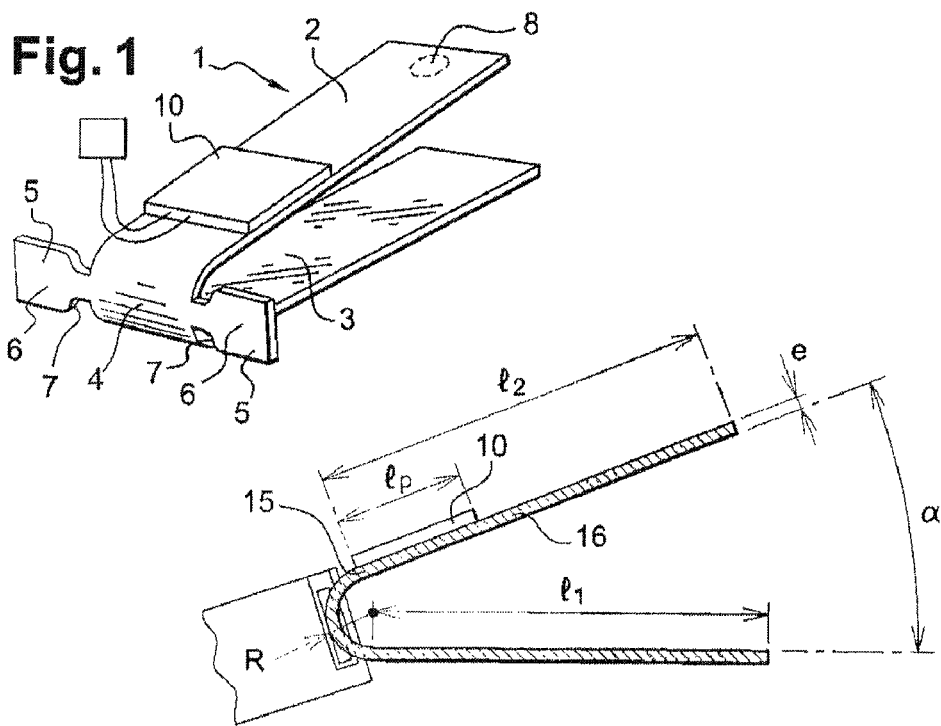
Fig. 2a
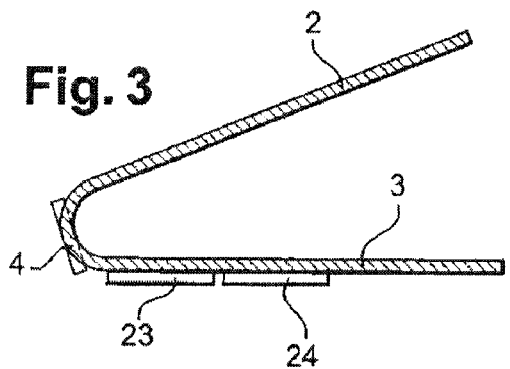
Fig. 3
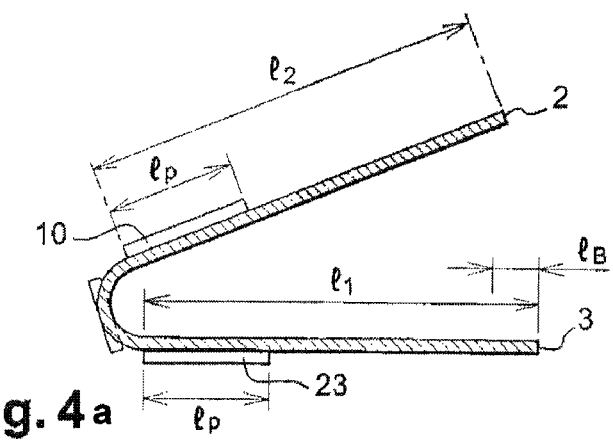
Fig. 4a

V-SHAPED OR U-SHAPED PIEZOELECTRIC DEVICE FOR GENERATING AN ELECTRICAL VOLTAGE

CROSS REFERENCE TO RELATED APPLICATIONS

This application is a national stage filing under section 371 of International Application No. PCT/FR2009/051399 filed on Jul. 13, 2009, and published in French on Jan. 21, 2010 as WO 2010/007309 and claims priority of French application No. 0854879 filed on Jul. 17, 2008, the entire disclosure of these applications being hereby incorporated herein by reference.

FIELD OF THE INVENTION

The invention relates to the field of devices for generating electricity which use conversion of mechanical energy into electrical energy by means of piezoelectric elements.

The invention relates more especially to a new mechanical architecture of such a device which confers major advantages in terms of efficiency and implementation in particular.

DESCRIPTION OF THE PRIOR ART

Generally speaking, many systems which use electrical or electronic components need to be self-sufficient in terms of energy, especially if they cannot be linked or connected to an external energy source. Examples of such systems include mobile devices as well as stationary devices or apparatus which are installed in locations where it is difficult, complicated or too expensive to lay a power cable.

Thus, many apparatuses are equipped with storage batteries or dry cells which provide electrical power. However, such storage batteries have a limited battery operation time and this means they must be replaced at regular intervals.

Proposals have been made to equip certain apparatuses with devices which make it possible to generate electrical energy by converting energy which is available in the vicinity of the apparatus. Examples include photovoltaic devices which convert luminous energy and devices based on piezoelectric elements which make it possible to convert mechanical energy into electrical energy as a result of the deformation of a piezoelectric element.

Many devices have already been suggested for generating electrical energy by exploiting the piezoelectric effect. Such devices generally include a vibrating plate fixed by one of its ends to a fixed support with the other free end being capable of moving due to the effect of a mechanical force which is applied to it. This force may originate, for instance, from the movement of a counterweight attached to the end of the plate, in this case energy is recovered from a vibratory system or even from an external mechanical device which applies a point force to the end of the plate, thereby causing it to oscillate. This is the case, for example, with the device described in Document DE 10 2006 025 963.

One or more piezoelectric elements are mounted on one or both sides of the plate and are therefore subjected to deformation as the plate oscillates. This deformation therefore produces an electrical voltage across the terminals of the piezoelectric element. This voltage can then be rectified in order to charge a capacitive component of the capacitor type in order to power a load. Such devices are described, for example, in Documents US 2005/0280561, EP 0 725 452, DE 296 14 851 U as well as in U.S. Pat. No. 7,005,778.

The one common feature of all these mechanisms is the fact that their operation is the result of deformation of a substantially straight beam which is fixed at one or both of its ends. Such a design has numerous drawbacks. In fact, from an energy standpoint, these systems have relatively poor efficiencies of the order of several percent at most. The term "efficiency" is taken to mean the ratio of the electrical energy supplied to the capacitive component located downstream from the piezoelectric component to the mechanical energy delivered to the system.

This poor efficiency therefore generally makes it necessary to increase the number of conversion systems in order to obtain a satisfactory quantity of electrical energy, thereby increasing the overall size of the conversion device as well as its cost.

Another drawback of vibratory beam systems is the fact that the point of attachment to the fixed support is subjected to considerable mechanical stresses because of the moment generated at the level of the end restraint and the propagation of vibrations into the support.

These mechanical stresses therefore make it necessary to ensure mechanically robust, bulky end restraint which increases the cost of the system and has an impact on its performance.

One of the objects of the invention is to produce a system which is simple in design yet offers efficiency which is markedly better than that of existing systems and can be manufactured at reasonable cost.

SUMMARY OF THE INVENTION

The invention therefore relates to a piezoelectric device for generating an electrical voltage. In a known manner, such a device comprises a vibrating plate having a portion integral with a fixed support. This plate has at least one free end capable of moving under the effect of a mechanical force. This plate comprises at least one piezoelectric element being attached to one face of the plate. This element is deformed by oscillations of the plate that result from a mechanical force which is applied to it by an external device, thus generating an electrical voltage. These oscillations may also be the result of vibrations that are extraneous to the system.

According to the invention, this device is characterised in that the plate has a U-shaped general configuration and possesses two substantially plane branches joined by a curved linking portion. The linking portion makes the plate integral with the support.

In other words, the invention involves using a plate which does not have a planar, substantially straight geometry as is the case with the prior art; instead it has a configuration which is curved or bent in a U or V shape.

In the case of pulsed operation, one or both of the branches of this curved plate are subjected to the mechanical pulse that causes deformation of the plate which is transmitted to the opposite branch and vice versa. The linking zone between the two branches acts as a fixed point through which energy and the amount of movement that is transferred from one branch to another travel. In the preferred case of symmetrical operation, with virtually simultaneous pulses being applied to the two branches, the mechanical stresses at the level of the fixing point are reduced.

These stresses, especially the moment, can be virtually zero in cases where the two branches have similar lengths. However, in certain situations, the branches may have different lengths, depending on the desired result.

In practice, the curved plate may have a configuration in which the two branches are virtually parallel so as to form a U and at least form an angle of less than 60° relative to each other in order to have a V configuration.

The device according to the invention has a high mechanical quality factor, i.e. in excess of 100, for a combination formed by the metal spring plate and the piezoelectric element that is attached to it. Such mechanical damping is therefore especially weak so that energy dissipation due to mechanical damping after a pulse has been applied is also low.

Energy is therefore extracted via the piezoelectric element over a fairly long period of time of the order of tenths of a second, depending on the geometry of the device.

Achieving a high mechanical quality factor is highly desirable in order to limit excessive damping of the natural oscillations which would otherwise adversely affect the efficiency of the device. This is why, generally speaking, the overall volume of the piezoelectric element, which is the product of its surface area and thickness, must be optimised and remain small compared to the equivalent volume of the plate.

Thus, the invention can be optimised by varying the surface area that the piezoelectric element occupies on the plate as well as its thickness.

Adjusting the surface area produced good results when the piezoelectric element covered substantially the entire width of the plate. In this case, the length of the piezoelectric element represents approximately 10% to 35% of the length of the branch of the plate on which it is fitted. In fact, and contrary to a widely-held prejudice, it is not necessary to cover the entire length of the plate with piezoelectric material because this results in devices that are too bulky and have a low quality factor compared with the design according to the invention.

As far as the thickness of the piezoelectric element is concerned, it is preferable to favour piezoelectric elements that have a small overall thickness compared to the plate that accommodates them; once again, this is in contrast to devices according to the prior art which, conversely, favour fairly thick piezoelectric elements in order to increase the quantity of electric charges produced, but to the detriment of the quality factor and hence the overall efficiency of energy recovery.

Good results were obtained when the thickness of the piezoelectric element represented roughly 25 and 35% of the overall thickness of the branch that supports it, i.e. the combined thickness of the piezoelectric element and the plate.

In other words, the piezoelectric element has a thickness equal to roughly 30 to 55% of the thickness of the plate.

Obviously, these measurements apply to piezoelectric elements and plates that have a uniform thickness or in respect of their average thickness.

It is possible to envisage different variants as far as the location(s) of the piezoelectric element(s) is/are concerned.

Preferably and where the device is actuated by two branches, each branch has a piezoelectric element. In cases where a mechanical pulse is only applied to one branch, the piezoelectric element can be located on the branch that is subjected to that pulse. Generally speaking, the element may be located on the outer or inner face of this branch, preferably on the side of the branch that is located close to the curved linking portion. More precisely, the piezoelectric element may be located in an area of the second branch that extends from the curved linking portion to a point located at a distance equal to 20 to 50% and preferably 20 to 35% of the length of the branch. In other words, the piezoelectric element is preferably located in that half of the branch which is located close to the linking portion. This preferred location area is especially advantageous for pulsed operation where the branch is subjected to deformation.

In another variant of actuation by pulses applied to only one branch, the piezoelectric element may be located on the opposite branch, i.e. the branch that is not subjected to pulses. In another variant, it is even possible to have piezoelectric elements on both branches, namely the branch that is subjected to pulses and that which is not.

It is also possible to combine these different variants by placing several piezoelectric elements on the vibrating plate, locating them on both the branches. Such combinations make it possible to obtain extremely useful efficiencies in excess of 25% compared with efficiencies of less than 3% which are observed on systems according to the prior art. In practice, for the sake of efficiency, preference is given to solutions whereby the piezoelectric element(s) is/are located at least on the plate that is subjected to pulses.

Advantageously, the ratio of the length of one of the branches of the plate to its thickness exceeds 20, preferably 40 and, advantageously, is around 75.

These length and thickness dimensions are measured in areas where they are substantially uniform and the thickness of the piezoelectric element is subtracted from them.

Such a length to height ratio also helps obtain the high quality factor which enables the invention to achieve efficiencies that are markedly higher than those observed to date using similar devices.

In practice, the device can be mounted on the fixed support in various ways, namely by bonding or welding or by using mechanical means. Thus, one can ensure gripping of the plate by an appropriate mechanism that is supported in one or more lateral openings made in the plate at the level of the linking zone. It is also possible to provide one or more slots at the level of the plate in a transverse or longitudinal direction so that a fixture integral with the fixed support can be restrained therein. It is also possible to combine various lateral and/or central openings depending on the configuration of the plate. Preferably, mounting can be obtained thanks to protrusions that extend laterally at the level of the linking portion and form fixing/restraining points on the support. Lateral positioning makes it possible to limit the stresses to which the restraining points are subjected once the pulse has been generated and even during pulsed operation if it is symmetrical.

It has been observed that efficient energy recovery in the case of a device that is impulsively actuated implies that the energy transmitted at the time of a pulse is stored in the plate, thus reducing energy dissipation as much as possible, especially dissipation due to mechanical phenomena. Insofar as the device according to the invention is characterised by low internal energy dissipation due to its high quality factor, the main energy dissipation mode remains the transfer of energy to the fixed support.

This is why the way in which the plate is mounted on the fixed support has a significant impact on the efficiency obtained. From a practical viewpoint, preference is given to linking solutions that ensure satisfactory decoupling between energy stored in the plates and the fixed support. This is why attempts are made to reduce stress transfer modes that cause deformation in the interface and therefore energy losses.

Thus, the linking portion between the two branches is minimised as much as possible and can be designed to be subjected to a symmetrical stress. During phases when the plates are extended, the device must be capable of restoring the mechanical elastic energy that is accumulated during the compression phase.

In practice, the piezoelectric element can be made of various materials, in particular, lead zirconate titanate (PZT) based materials, but also any other piezoelectric material, especially monocrystalline materials such as lead magnesium niobate and lead magnesium niobate titanate alloys (PNM-PT). In order to optimise efficiency, piezoelectric elements are selected which extend over almost the entire width of the plate, said plate being made of a material that has dynamic elastic strength properties which allow applications of the spring type as well as dimensional properties which are conducive to generating an oscillating regime and encouraging the propagation of vibrations. Examples include steels which have a "spring" type composition such as steel XC 75 S, in particular, or cold-worked stainless steel X10C R Ni 18 8 (T4) having breaking strengths ($R_m$) in excess of 1100 MPa. It is also possible to envisage using polymeric materials such as polyphenylene sulphide (PPS) for example,

BRIEF DESCRIPTION OF THE DRAWINGS

The way in which the invention is implemented and its resulting advantages will be readily apparent from the description of the following embodiments, reference being made to the accompanying drawings in which:

FIG. 1 is a schematic perspective view of the device according to the invention built in accordance with a first variant;

FIG. 2a is a side view of the device in FIG. 1;

FIGS. 3, 4a and 4b are side views of alternative embodiments;

DESCRIPTION OF THE PREFERRED EMBODIMENTS

Figure 2B:
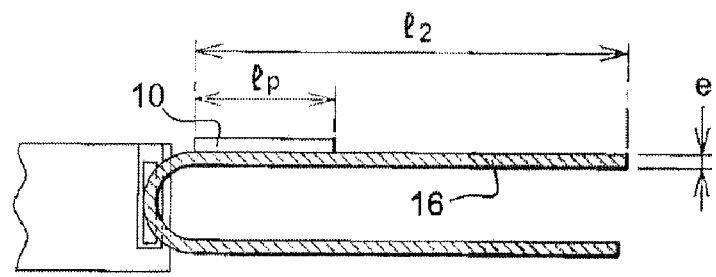
FIG. 2b is a side view of a device having parallel branches.

The device according to the invention, shown in FIG. 1, is generally speaking in the form of a plate (1) made of a rigid material which is curved in a U or V shape. More precisely, plate (1) comprises two substantially plane portions (2, 3) forming the branches of the U which are joined together via a curved linking portion (4). Curved linking portion (4) comprises two protrusions which are obtained by stamping and bending during manufacture of the plate. These protrusions (5) comprise a retention tab (6) connected to the rest of the plate by a strap (7) that has a small cross-sectional area in order to control the quantity of energy transferred between the plate and the support. Protrusions (5) are, for example, engaged in a fixed support (18).

Figure 5:
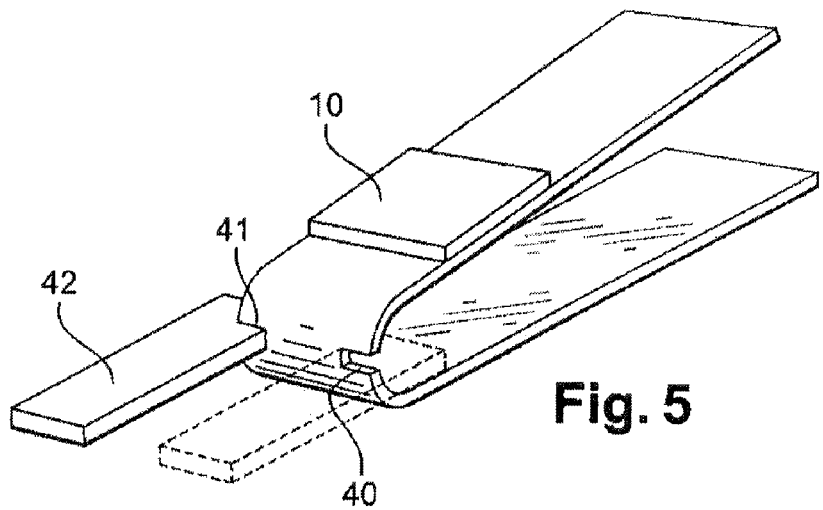
FIG. 5 is a schematic perspective view of an alternative embodiment in terms of the way in which the device is fixed to the support.

In the alternative embodiment shown in FIG. 5, the curved linking portion (54) of plate (50) has two notches (40, 41) that are oriented at right angles to the edge of the plate.

These notches (40, 41) accommodate two retention tabs (42) which are each force fitted into the notch. It is possible for the two retention tabs to be joined in order to form a single U-shaped part or fork which cooperates simultaneously with both notches (40, 41). These retention tabs (42) are designed to be attached to the fixed support by various means.

The retention tabs (42) are advantageously made of a material that is identical or mechanically very similar to the material of the plate so that the dynamic behaviour of the tab is identical to that of the plate.

As shown in FIG. 1, branch (2) has an end (8) capable of receiving a mechanical pulse which causes deformation of the plate, especially at the level of curved portion (4), and then oscillating when the force is no longer applied with the plate tending to return to its initial position. Naturally, it is possible to obtain symmetrical operation whereby both branches (2, 3) each receive a pulse, preferably simultaneously.

According to the invention, plate (1) is associated with at least one piezoelectric element which, in the form shown in FIG. 1, is positioned on the outer face of branch (2). This piezoelectric element (10) is secured by a conventional bonding process, by using an epoxy adhesive for example.

In practice, various types of piezoelectric materials can be used depending on the desired application and required power ratings.

By way of example, satisfactory results were obtained using lead zirconate titanate-type piezoelectric materials. More generally speaking, many piezoelectric materials can be used as long as they have a coupling coefficient $k_{31}$ higher than 0.3 and a mechanical quality factor higher than 150.

In practice, the dimensions and positioning of the various elements can be optimised in order to ensure maximum efficiency. Thus, as shown in FIG. 2a, the angle α which the two straight branches (2, 3) of the plate form relative to each other can be less than approximately 45° in order to minimise the torque and swivelling at the level of linking portion (4) when a mechanical pulse is applied to end (8) of branch (2). In an optimised form, this angle can be virtually zero with branches (2, 3) parallel, as illustrated in FIG. 2b. This torque can be virtually zero in the preferred case where both branches are actuated almost simultaneously by pulses having similar amplitudes.

The positioning of piezoelectric element (10) on the second branch (2) of the plate also has an impact on the performance level achieved. It has been observed that it is advantageous to locate the piezoelectric element (10) in an area of the branch which is as close as possible to curved linking portion (4). This optimal positioning area therefore extends, firstly, from the point (15) where branch (2) joins curved linking portion (4) to, secondly, a second point (16) located at a distance equal to 10 to 50% of the length $L_2$ of branch (2) from first point (15). The length $L_P$ of piezoelectric element (10) thus represents 10 to 50% of the length $L_2$ of branch (2).

The bend radius (R) of curved linking portion (4) is as small as possible. In practice, it is approximately several tenths of a millimeter to several millimeters depending, in particular, on the thickness (e) of the plate which is itself selected depending on the thickness of the element made of a piezoelectric material (10).

The length $L_1$ of branch (3) can be selected so that it is substantially identical to the length $L_2$ of second branch (2) if one wishes to optimise the value of the system's mechanical quality coefficient ($Q_m$). Nevertheless, using a first branch (3) having a different length can have an effect on the amplitude of the harmonics of the signal output by piezoelectric element (10) and hence the efficiency of the device.

In practice, piezoelectric element (10) may be made by associating several separate piezoelectric elements in series or in parallel.

As stated above, the piezoelectric element(s) can be located in various positions on the plate, especially on one of the branches (3) as shown in FIG. 3. The piezoelectric element(s) (23, 24) can be bonded on the outer face of branch (3) either in close proximity to curved linking portion (4) as far as element (23) is concerned or closer to the end as far as piezoelectric element (24) is concerned. The length of each of these elements and their precise positioning depend on the overall geometry of the plate and its modes of vibration and are chosen so as to optimise its energy efficiency.

Good results have been obtained using the configuration shown in FIG. 4a where the piezoelectric elements are located on the two branches of the plate and are simultaneously, symmetrically actuated by pulses applied to both the branches. A first piezoelectric element (10) is located on plate (2) and a second element (23) is located symmetrically on the outer face of the first plate (3) close to the curved portion (4). More precisely, the description of the particular embodiment which follows is given with specified dimensional details only in order to demonstrate the advantage of the invention in terms of efficiency. The elastic plate chosen is based on a spring steel of the X 10 C R Ni 18 8 stainless steel type and has a thickness (e) of 0.8 mm and a width of 20 mm. The length L of the second branch (2) is 100 mm. The neutral axis radius of the curved area (4) is 3 mm. Branch (3) has a length of 103 mm and the assembly is secured at the level of curved linking portion by a hand-held support. The piezoelectric elements used are located at the end of their respective branches close to the curved portion (4). The piezoelectric elements used are of the PZT ceramic type. The elements are used in pairs and each have a width of 10 mm which matches the width of the plate, a length of 20 mm and a thickness of 0.3 mm. Their polarisation direction is parallel to their thickness. It is possible to calculate the efficiency of the device as the ratio of the electrical energy collected on the output of the piezoelectric elements, after rectification and storage in a capacitor, to the mechanical energy delivered to the system. More precisely, the mechanical energy delivered to the system corresponds to a force having an amplitude (F) which is applied to the end (8) of the free branch in order to cause a displacement excursion (f). In a test with an excursion of 6 mm, the measured mechanical energy was 5.04 mJ. The electrical energy supplied by the piezoelectric elements is stored in a capacitance formed by a 4.7 µF capacitor after rectification by a standard diode bridge. The measured voltage is around 25 V and so the corresponding efficiency is approximately 29%. Other capacitance values can be selected depending on the electrical constraints imposed by the device, especially in order to avoid excessively high voltages.

Figure 4B:
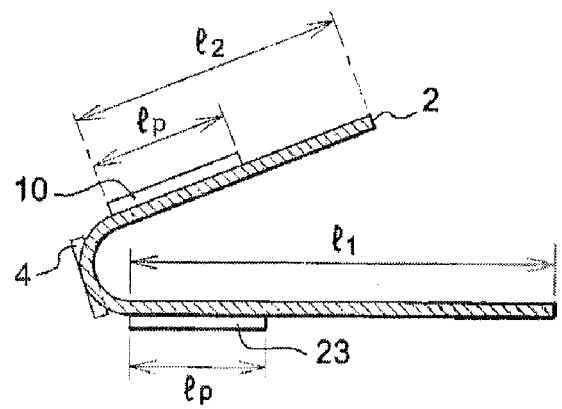

Obviously, this example is given merely by way of illustration and does not restrict the scope of the invention in any way whatsoever; the invention has an extremely wide variety of alternative forms which are all in accordance with the principles of the invention as stated above. For example, FIG. 4b depicts an embodiment similar to that of FIG. 4a but with branches of substantially different lengths.

Such a device has many advantages, including the following:
  Electromechanical coupling k greater than that achieved by the prior art and using a limited quantity of piezoelectric material
  A mechanical quality factor which is defined at the time of design and is, for instance, in excess of around 100 when recovering impulsive energy;
  The use of common types of piezoelectric materials which can be used in smaller quantities, thus providing a corresponding cost saving;
  The use of commonly available materials in order to realise the vibrating plate;
  A simple manufacturing method which produces a highly reliable device;
  Very good efficiency compared with existing systems;
  An estimated service life of several decades.
  An ecologically sustainable and durable energy recovery system
  Energy transfer at the point of attachment is minimised.

Industrial Applications

Such a device can be widely used as an electrical power source which replaces storage batteries and dry cells, for wireless sensor network applications or for any application that requires a self-sufficient energy source which has a long service life.

Typical applications include instruments for measuring physical parameters in industries which use petrochemical or pharmaceutical type processes. Other applications include, in particular, temperature, pressure or flow rate sensors, especially in water or gas distribution systems. Other applications involve electrical appliances of the electric switch type, cordless door chimes or devices to detect opening. Miniaturised versions of the invention can also be used to power micro-electro-mechanical systems (MEMS).

The invention claimed is:

1. Piezoelectric device for generating an electrical voltage, comprising a vibrating plate having a portion integral with a fixed support and at least one free end capable of moving under effect of a mechanical pulse, at least one piezoelectric element being attached to one face of the plate so as to deform under effect of oscillations of the plate that result from said mechanical pulse, thus generating an electrical voltage, wherein the plate comprises two substantially planar branches joined by a curved linking portion integral with the support, and the two branches form an angle of less than 60° relative to each other.

2. Device as claimed in claim 1, wherein the two branches are substantially parallel.

3. Device as claimed in claim 1, wherein the plate has a U-shaped or V-shaped general configuration.

4. Device as claimed in claim 1, wherein the piezoelectric element is located on an inner face and/or an outer face of either branch.

5. Device as claimed in claim 4, wherein the piezoelectric element is located on either branch in an area which extends from the curved linking portion to a point located at a distance equal to 10 and 50% of a length of the branch.

6. Device as claimed in claim 5, wherein the piezoelectric element is located on either branch in an area which extends from the curved linking portion to a point located at a distance equal to 20 to 35% of the length of the branch.

7. Device as claimed in claim 1, comprising several piezoelectric elements located on either branch.

8. Device as claimed in claim 1, wherein the piezoelectric element extends over virtually an entire width of the plate.

9. Device as claimed in claim 1, wherein the two branches are of substantially equal length.

10. Device as claimed in claim 1, wherein the piezoelectric element takes up a surface area of between 10 and 35% of a branch on which the element is mounted.

11. Device as claimed in claim 1, wherein thickness of the piezoelectric element represents 30 to 55% of thickness of the plate.

12. Device as claimed in claim 1, wherein a ratio of length to thickness of one of the branches of the plate exceeds 20.

13. Device as claimed in claim 12, wherein the ratio of length to thickness of one of the branches of the plate exceeds 40.

14. Device as claimed in claim 13, wherein the ratio of length to thickness of one of the branches of the plate is around 75.

15. Device as claimed in claim 1, wherein the linking portion comprises protrusions that extend laterally and form fixing points on the fixed support.

16. Device as claimed in claim 1, wherein the linking portion comprises one or more lateral and/or central openings accommodating fixing means integral with the fixed support.

* * * * *